United States Patent [19]

Ohno et al.

[11] Patent Number: 4,656,606

[45] Date of Patent: Apr. 7, 1987

[54] SEMICONDUCTOR MEMORY DEVICE PROVIDING A SELECTION CIRCUIT CHANGE-OVER ARRANGEMENT

[75] Inventors: Nobuhiko Ohno, Tokorozawa; Katsumi Ogiue, Tokyo; Katsuya Mizue, Koganei; Noriyoshi Okuda, Mitaka, all of Japan

[73] Assignees: Hitachi, Ltd.; Hitachi Microcomputer Engineering Co Ltd, of JPX

[21] Appl. No.: 579,960

[22] Filed: Feb. 14, 1984

[30] Foreign Application Priority Data

Feb. 21, 1983 [JP] Japan ............................ 58-26196

[51] Int. Cl.⁴ .......................................... G11C 11/34
[52] U.S. Cl. ..................................... 365/104; 365/189; 365/230
[58] Field of Search ................ 365/104, 105, 189, 230

[56] References Cited

U.S. PATENT DOCUMENTS 4,385,368  5/1983  Principi et al. ............... 365/105

FOREIGN PATENT DOCUMENTS 2132652  1/1972  Fed. Rep. of Germany.
2654950  6/1977  Fed. Rep. of Germany.

Primary Examiner—James W. Moffitt
Attorney, Agent, or Firm—Antonelli, Terry & Wands

[57] ABSTRACT

A read-only memory has a terminal for receiving a writing current and a data input/output terminal. In the writing operation, the writing current is supplied to the terminal which is different from the data input/output terminal. Therefore, a data output circuit can be constituted by an ECL circuit having a relatively low withstand voltage, and a selection circuit related to the reading operation is achieved by using an ECL circuit. Accordingly, the read-only memory performs the reading operation at high speeds. During the writing operation, a different selection circuit is used which can withstand high voltages.

6 Claims, 2 Drawing Figures

SEMICONDUCTOR MEMORY DEVICE PROVIDING A SELECTION CIRCUIT CHANGE-OVER ARRANGEMENT

BACKGROUND OF THE INVENTION

The present invention relates to a semiconductor memory device, and particularly to a programmable read-only memory (hereinafter referred to as PROM) which is made up of bipolar transistors.

In order to increase the speed of reading operation, there has been disclosed in Japanese Patent Laid-Open No. 48944/1976 (Laid-Open on April 27, 1976) a bipolar PROM which consists of bipolar transistors and which is provided with row- and column-selecting circuits consisting of emitter-coupled logic (hereinafter referred to as ECL) circuits and with row- and column-selecting circuits consisting of transistor-transistor logic (hereinafter referred to as TTL) circuits. According to this bipolar PROM, when the reading operation is to be carried out, desired memory elements are selected among a plurality of memory elements by the row- and column-selecting circuits consisting of ECL circuits. When the writing operation is to be carried out, desired memory elements are selected among the plurality of memory elements by the row- and column-selecting circuits consisting of TTL circuits. In the reading operation, desired memory elements are selected by the row- and column-selecting circuits consisting of ECL circuits. Therefore, the reading operation can be performed at high speeds.

The above-mentioned bipolar PROM, however, requires two sets of row- and column-selecting circuits and, hence, requires an increased number of elements for constituting such circuits. Therefore, the bipolar PROM tends to become bulky and consumes increased amounts of electric power.

When the bipolar PROM of a large memory capacity is to be constructed, in particular, the number of rows and columns increases in the memory array. Therefore, construction of two sets of row- and column-selecting circuits makes it difficult to realize the memory device.

SUMMARY OF THE INVENTION

The object of the present invention is to provide a semiconductor memory device which has simplified circuit construction and which is capable of performing the reading operation at high speeds.

Another object of the present invention is to provide a semiconductor memory device which has simplified circuit construction without increasing the number of external terminals and which accomplishes high-speed operation.

A further object of the present invention is to provide a semiconductor memory device which is capable of performing the reading operation at high speeds and which has reduced power dissipation.

Still further objects and novel features of the invention will become apparent from the description of the specification and the accompanying drawings.

DESCRIPTION OF THE PREFERRED EMBODIMENTS

Figure 1:
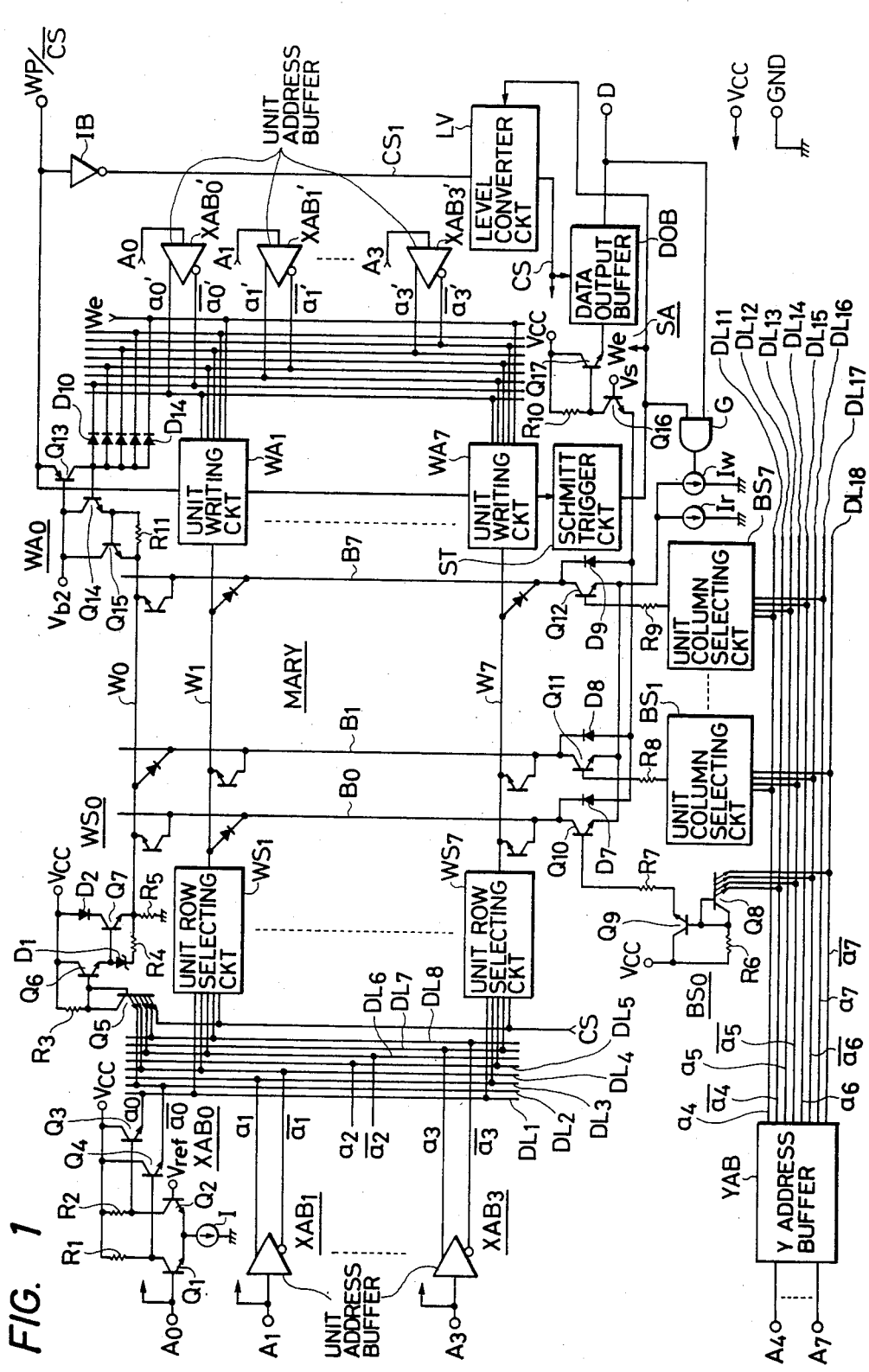
FIG. 1 is a circuit diagram of a bipolar PROM to which the present invention is adapted.

FIG. 1 is a circuit diagram of an embodiment in which the present invention is adapted to a bipolar PROM.

The bipolar PROM shown in FIG. 1 is formed on a semiconductor substrate such as a silicon substrate by a known semiconductor integrated circuit technique. In FIG. 1, symbols A0 to A7, WP/$\overline{CS}$, D, Vcc and GND denote external terminals, respectively. For easy comprehension of the invention, FIG. 1 illustrates the construction of memory array MARY in a simplified manner.

That is, in FIG. 1, row lines W0 to W7 are representatively shown among many row lines (word lines) which constitute the memory array MARY, and column lines B0 to B7 are representatively shown among many column lines (bit lines) which constitute the memory array MARY. In the memory array MARY, a memory element (memory cell) is provided at each of the intersecting points of the row lines and column lines. FIG. 1 representatively shows memory elements that are provided at the intersecting points of the column lines B0 to B7 and row lines W0 to W7. Although there is no particular limitation, the memory element consists of a bipolar transistor of which the base is open. The emitter (first or second terminal) of the bipolar transistor constituting the memory element is connected to the row line, and the collector (second or first terminal) is connected to the column line. In the memory array MARY of FIG. 1, the memory elements represented by diodes stand for the transistors of which the emitter-base junction is short-circuited by the writing operation.

In FIG. 1, symbol XAB denotes an address buffer which consists of a plurality of unit address buffers XAB0 to XAB3 each of which being served, via address input terminals A0 to A3, with part of address signals that are sent from a suitable circuit device that is not shown. To simplify the diagram, FIG. 1 concretely illustrates the circuit of unit address buffer XAB0 only among these unit address buffers.

The unit address buffer XAB0 consists of a pair of NPN-type bipolar transistors Q1, Q2 which are coupled in a differential manner, a constant-current source I connected to the common emitters, load resistors R1, R2 connected to the collectors of the transistors Q1, Q2, respectively, an NPN-type bipolar transistor Q4 which constitutes an emitter follower to receive the output from the collector of the transistor Q1, and an NPN-type bipolar transistor Q3 which constitutes an emitter follower to receive the output from the collector of the transistor Q2. Namely, the unit address buffer XAB0 consists of an ECL circuit. Between the pair of transistors coupled in a differential manner, the base of one transistor Q2 is served with a predetermined reference voltage Vref and the base of the other transistor Q1 is served with an address signal A0 via the input terminal A0. Therefore, the unit address buffer XAB0 forms an internal address signal $\overline{a0}$ which is substantially in phase with the address signal A0, and forms an internal address signal a phase substantially opposite to that of the address signal A0. That is, the unit address buffer XAB0 forms complementary internal address signals a0, $\overline{a0}$.

Other unit address buffers XAB1 to XAB3 are also constructed in the same manner as the unit address buffer XAB0. Accordingly, the address buffer XAB forms internal address signals a0 to a3 that are substantially in phase with the address signals A0 to A3 received via address input terminals A0 to A3, and forms internal address signals $\overline{a0}$ to $\overline{a3}$ of which the phases are substantially inverted relative to the address signals. In short, the address buffer XAB forms internal complementary address signals a0, $\overline{a0}$ to a3, $\overline{a3}$ accordance with the address signals received via address input terminals A0 to A3.

The internal complementary address signals a0, $\overline{a0}$ to a3, $\overline{a3}$ formed by the address buffer XAB are supplied to a row-selecting circuit WS which will be mentioned below. That is, as will be described later in detail, the row-selecting circuit WS in the reading operation selects a row line among a plurality of row lines constituting the memory array MARY responsive to address signals AX0 to AX3.

The row-selecting circuit WS consists of a plurality of unit row-selecting circuits WS0 to WS7. Among these unit row-selecting circuits, FIG. 1 concretely illustrates the circuit of the unit row-selecting circuit WS0 only.

The unit row-selecting circuit WS0 constitutes a type of address decoder, and is made up of a multi-emitter NPN-type bipolar transistor Q5 which assumes the form of a diode with its base and collector being connected together, a load resistor R3 connected to the collector of the transistor Q5, a Darlington-connected NPN-type bipolar transistors Q6, Q7 which receive the output from the collector of the transistor Q5 and which drive the row line W0, and a resistor R5 connected to the emitter of the transistor Q7. A diode D2 is connected to the collector of the transistor Q7, and a bias resistor R4 and a Schottky diode D1 are connected in series across the base and the emitter of the transistor Q7. The diodes D1, D2 work to prevent the breakdown of the transistor Q7 during the writing operation. Internal address signals $\overline{a0}$, $\overline{a1}$, $\overline{a2}$ and $\overline{a3}$ are, respectively, applied to the emitters of the transistor Q5.

Unit row-selecting circuits WS1 to WS7 constructed in the same manner as the above-mentioned unit row-selecting circuit WS0 are provided for other row lines W1 to W7. The internal address signals a0, $\overline{a0}$ to a3, $\overline{a3}$ are supplied in predetermined combinations to each of the unit row-selecting circuits WS1 to WS7. That is, internal address signals are applied to the unit row-selecting circuits, and a row line is selected out of the plurality of row lines by a unit row-selecting circuit coupled thereto responsive to the internal address signals a0, $\overline{a0}$ to a3, $\overline{a3}$.

Though not diagramed, constant-current sources are connected to common lines DL1 to DL8 which transmit internal address signals to the unit row-selecting circuits.

The remainder of the address signals produced by the above-mentioned suitable circuit device (not shown) is supplied to the address buffer YAB via address input terminals A4 to A7. Like the above-mentioned address buffer XAB, the address buffer YAB consists of a plurality of unit address buffers. The unit address buffers are constituted by the same ECL circuits as those of the unit address buffers which form the address buffer XAB. Further, the unit address buffers constituting the address buffer YAB have the same construction relative to each other.

Upon receipt of address signals A4 to A7 via address input terminals A4 to A7, the address buffer YAB forms the internal complementary address signals a4, $\overline{a4}$ to a7, $\overline{a7}$ like the address buffer XAB. That is, the address buffer YAB forms internal address signals a4 to a7 which are substantially in phase with the address signals A4 to A7 and internal address signals $\overline{a4}$ to $\overline{a7}$ of which the phases are substantially inverted relative to the address signals A4 to A7. These internal complementary address signals are supplied to the column-selecting circuit BS which will be described below.

As will be mentioned later, the column selecting circuit BS selects a column line designated by address signals A4 to A7 out of a plurality of column lines constituting the memory array MARY in either the reading operation or the writing operation. The column-selecting circuit BS consists of a plurality of unit column-selecting circuits BS0 to BS7. To simplify the diagram, FIG. 1 concretely shows the circuit of the unit column-selecting circuit BS0 only among these unit column-selecting circuits.

The unit column-selecting circuit BS0 constitutes an address decoder, and is made up of a multi-emitter NPN-type bipolar transistor Q8 which assumes the form of a diode with its base and collector being commonly connected together, a load resistor R6 connected to the collector of the transistor Q8, an NPN-type bipolar transistor Q9 which constitutes an emitter follower to receive the output from the collector of the transistor Q8, and a switching NPN-type bipolar transistor (column switch) Q10 connected to the column line B0, the operation of the transistor Q10 being controlled by the output of the transistor Q9 which is supplied via a resistor R7. The internal address signals $\overline{a4}$, $\overline{a5}$, $\overline{a6}$ and $\overline{a7}$ are, respectively, applied to the emitters of the multi-emitter transistor Q8.

The unit column-selecting circuits BS1 to BS7 constructed in the same manner as the unit columnselecting circuit BS0 are connected to other column lines B1 to B7. The internal address signals a4, $\overline{a4}$ to a7, $\overline{a7}$ are supplied in predetermined combinations to the unit column-selecting circuits BS1 to BS7. Namely, the internal address signals are applied to the unit column-selecting circuits, and a column line designated by the internal address signals a4, $\overline{a4}$ to a7, $\overline{a7}$ selected by a unit column-selecting circuit out of the plurality of column lines.

Although not diagramed, constant-current sources are connected to common lines DL11 to DL18 which transmit the internal address signals to the unit column-selecting circuits.

To simplify the illustration, the column lines B1, B7 that are representatively shown among the plurality of column lines, are provided with switching transistors (column switches) Q11, Q12 that work in the same manner as the above-mentioned transistor Q10, and with base resistors R8, R9 connected to the bases of these transistors. To the emitters of these switching transistors (column switches) Q10 to Q12 are commonly connected in parallel a constant-current source Ir which supplies a reading current Ir and a current source Iw which supplies a writing current Iw.

Although there is no particular limitation, the current source Iw is constituted by a transistor of which the operation is controlled by the output of an AND gate circuit G. The transistor constituting the current source Iw assumes, for example, the operative condition when the AND gate circuit G produces an output of the high level.

A writing circuit WA is connected to the row lines W0 to W7. As will be mentioned later, the writing circuit WA supplies a writing current to a row line that is designated by the address signals A0 to A3 out of the plurality of row lines. The writing circuit WA consists of a plurality of unit writing circuits WA0 to WA7. FIG. 1 concretely illustrates the circuit of the unit writing circuit WA0 only among these unit writing circuits WA0 to WA7.

The unit writing circuit WA0 consists of a PNP-type bipolar transistor Q13 and NPN-type bipolar transistors Q14 and Q15 which are coupled in the form of a thyristor to transmit a writing current signal WP, supplied from a terminal WP/$\overline{CS}$, to the row line W0. Though there is no particular limitation, the NPN-type bipolar transistors Q14 and Q15 are Darlington-connected to increase the current amplification factor. A bias resistor R11 is connected across the base and the emitter of the transistor Q15. A predetermined bias voltage Vb2 is applied to the base of the transistor Q13 which is connected in the form of a thyristor.

An address decoder is connected to the base of the transistor Q14 to selectively supply the writing current to the row line responsive to the address signals A0 to A3 in the writing operation. The address decoder is constituted by a diode logic circuit (matrix) consisting of diodes D10 to D14 connected to the base of the transistor Q14. That is, although there is no particular limitation, the address signals A0 to A3 from the address input terminals A0 to A3 are supplied to the writing address buffer XAB that will be mentioned later, and the internal complementary address signals a0', $\overline{a0'}$ to a3, $\overline{a3'}$ formed by the address buffer XAB are supplied in predetermined combinations to the aforementioned diode logic circuit. Therefore, the diode logic circuit forms selection signals responsive to the address signals A0 to A3.

Other unit writing circuits WA1 to WA7 are also constructed in the same manner as the above unit writing circuit WA0.

The internal address signals a0', $\overline{a0'}$ to a3', $\overline{a3'}$ are supplied in predetermined combinations to the unit writing circuits WA1 to WA7. That is, the internal address signals are supplied to the unit writing circuits, and the writing current is supplied from a unit writing circuit to a row line designated by the internal address signals a0', $\overline{a0'}$ to a3', $\overline{a3'}$ out of the plurality of row lines.

The writing address buffer XAB consists of a plurality of unit address buffers XAB0' to XAB3' that have the same construction. Although there is no particular limitation, the unit address buffer is made up of a TTL circuit.

A reading diode D7 is connected to the column line B0 so as to work in a differential manner relative to the memory element connected to the column line B0. Reading diodes D8 to D9 are connected to the other column lines B1 to B7 so as to work in a differential manner relative to the memory elements like the above-mentioned case of column line B0. The column lines B0 to B7 are commonly connected, via these diodes D7 to D9, to the emitter of an NPN-type bipolar transistor Q16 which constitutes a sense amplifier SA. To the base of the transistor Q16 is applied a reading reference voltage Vs, and to the collector thereof is connected a load resistor R10. The collector output of the transistor Q16 is sent to a data output buffer DOB composed of an ECL circuit, via a transistor Q17 which constitutes an emitter follower. The output terminal of the data output buffer DOB is connected to the external terminal D. Operation of the data output buffer DOB is controlled by an internal chip selection signal CS produced by a level converter circuit LV that will be mentioned later. As will be described later in detail, the internal chip selection signal CS assumes the high level during the reading operation, and assumes the low level during the writing operation. When the internal chip selection signal CS assumes the high level, the data output buffer DOB assumes the operative condition responsive thereto. When the internal chip selection signal CS assumes the low level, the data output buffer DOB assumes the inoperative condition responsive thereto, and the output thereof exhibits a high impedance.

Although not specifically limited, the terminal WP/$\overline{CS}$ in the bipolar PROM of this embodiment also serves as an input terminal for receiving the chip selection signal $\overline{CS}$ and as a terminal for receiving the writing pulse WP.

When the chip selection signal $\overline{CS}$ applied to the terminal WP/$\overline{CS}$ has the low level, the bipolar PROM of this embodiment performs the reading operation. When the chip selection signal $\overline{CS}$ has the high level of, for example, 5 volts, on the other hand, the bipolar PROM is placed under the non-selected condition in which neither the reading operation nor the writing operation is carried out. Further, when a writing pulse WP of, for example, several tens of volts is supplied to the terminal WP/$\overline{CS}$, the bipolar PROM performs the writing operation. That is, when the voltage applied to the terminal WP/$\overline{CS}$ has the low level, the bipolar PROM performs the reading operation. When the voltage applied to the terminal WP/$\overline{CS}$ has a voltage of as high as several tens of volts, the bipolar PROM performs the writing operation. When the voltage applied has a value between the low level and the high voltage, e.g., has a voltage of, for instance, about 5 volts, the bipolar PROM is placed under the non-selected condition.

Although not specifically limited, whether the voltage applied to the terminal WP/$\overline{CS}$ has a high potential for writing operation or has the high level for placing the device under the non-selected condition, is discriminated by a Schmidt trigger circuit ST that will be mentioned later in detail with reference to FIG. 2.

The chip selection signal $\overline{CS}$ applied to the terminal WP/CS$\overline{CS}$ is input to the level converter circuit LV via the buffer circuit IB. Although not specifically limited, the buffer circuit IB according to this embodiment is composed of a TTL circuit and produces a chip selection signal CS1 of which the phase is inverted with respect to the chip selection signal ovs/CS/ .

The level converter circuit LV produces an internal chip selection signal CS upon receipt of the chip selection signal CS1 and a writing control signal We produced by the Schmidt trigger circuit ST that will be described later. When the writing control signal We has the low level, the level converter circuit LV converts the level of the chip selection signal CS1 into the ECL level, and produces the chip selection signal CS1 of the ECL level as an internal chip selection signal CS. When the writing control signal We has the high level, on the other hand, the level converter circuit LV produces the internal chip selection signal CS of the low level. That is, the writing control signal We of the high level causes forcibly the internal chip selection signal CS to assume the low level. The internal chip selection signal CS produced by the level converter circuit LV is supplied to the emitter of the multi-emitter transistor Q5 and the like of each of the unit row-selecting circuits and to the data output buffer DOB.

When the chip selection signal $\overline{CS}$ of the low level is produced to perform the reading operation, i.e., when the potential of the low level is applied to the terminal WP/$\overline{CS}$, the buffer circuit IB produces the chip selection signal CS1 of the high level.

In this case, the chip selection signal $\overline{CS}$ is also supplied to the writing circuit WA as well as to the Schmidt trigger circuit ST. The chip selection signal $\overline{CS}$ is of the low level having a potential lower than the threshold voltage of the Schmidt trigger circuit ST. Therefore, the Schmidt trigger circuit ST produces a writing control signal We of the low level.

Accordingly, the level converter circuit LV produces the internal chip selection signal CS of the high level (in the ECL level). Hence, the row-selecting circuit WS selects a row line designated by the address signals A0 to A3 out of the plurality of row lines W0 to W7.

The data output buffer DOB is set to the operative condition by the internal chip selection signal CS of the high level, and produces the data at the output terminal D responsive to the data produced by the sense amplifier.

On the other hand, when the chip selection signal $\overline{CS}$ of the high level is applied to the terminal WP/$\overline{CS}$, i.e., when the potential of the high level is applied to the terminal WP/$\overline{CS}$ to place the bipolar PROM under the non-selected condition, the buffer circuit IB produces the chip selection signal CS1 of the low level.

In this case, although there is no particular limitation, the chip selection signal $\overline{CS}$ is of the high level having a potential smaller than the threshold voltage of the Schmidt trigger circuit ST. Accordingly, the Schmidt trigger circuit ST produces the writing control signal We of the low level.

The level converter circuit LV therefor produces the internal chip selection signal CS of the low level. The internal chip selection signal CS of the low level is supplied to the emitter of the transistor Q5 constituting the unit row-selecting circuit. Hence, the row-selecting circuit WS places all of the row lines under the non-selected condition.

In the reading operation and in the chip non-selected condition, as described above, the writing control signal We assume the low level. Accordingly, the base potential of the transistor Q14 drops in each of the writing circuits, and no writing current is supplied from the writing circuits to the row lines.

The writing pulse of a high voltage which is applied to the terminal WP/$\overline{CS}$ to perform the writing operation, is also supplied to the emitters of transistors Q13 in the unit writing circuits WA0 to WA7, and to the Schmidt trigger circuit ST.

As will be mentioned later in detail with reference to FIG. 2, upon receipt of a writing pulse WP of a high voltage, the Schmidt trigger circuit ST produces a writing control signal We of the high level responsive thereto.

With the writing control signal We of the high level being supplied, the level converter circuit LV produces an internal chip selection signal CS of the low level irrespective of the potential at the terminal WP/CS$\overline{CS}$. Therefore, the unit row-selecting circuits WS0 to WS7 constituting the row-selecting circuit WS are all placedunder the non-selected condition. Namely, the transistors Q7 in each of the unit row-selecting circuits are rendered nonconductive. Thus, by rendering the drive transistors Q7 constituting the unit row-selecting circuits to be nonconductive during the writing operation, it is allowed to increase the withstand voltage of the unit row-selecting circuits against the high voltage applied to the row lines during the writing operation.

The writing control signal We is also supplied as a selection signal to the unit writing circuits constituting the writing circuit WA, and is supplied as a control signal to one input terminal of the gate circuit G.

During the writing operation, the writing control signal We of the high level is supplied as a selection signal to the unit writing circuits WA0 to WA7 which constitute the writing circuit WA. Therefore, the writing circuit WA supplies a writing current to the row line which is designated by the address signals A0 to A3 among the plurality of row lines.

Further, the writing control signal We of the high level is supplied to one input terminal of the gate circuit G so that it is opened. Therefore, the writing current source Iw is controlled according to the data supplied to the external terminal D. In this case, the output of the data output buffer DOB exhibits a high impedance due to the internal chip selection signal CS of the low level.

Column lines are selected by the column-selecting circuit BS in either the writing operation or the reading operation.

That is, the column-selecting circuit BS receives the internal complementary address signals a4, $\overline{a4}$ to a7, $\overline{a7}$, and forms a selection signal to turn on a switching transistor that is connected to a column line designated by the address signals A4 to A7 among the plurality of column lines B0 to B7. During the writing operation as will be mentioned later in detail, the reading current source Ir, or both the reading current source Ir and the writing current source Iw are connected to a column line via a switching transistor which is turned on by the column-selecting circuit BS. Whether the reading current source Ir is connected to the column line or both the reading current source Ir and the writing current source Iw are connected to the column line, is determined by the data supplied to the external terminal D. During the reading operation, on the other hand, the reading current source Ir is connected to the column line via a switching transistor.

According to the above-mentioned bipolar PROM, the data is written or read out on the basis of $\times 1$ bit construction, i.e., on the basis of 1-bit unit. The present invention, however, is in no way limited thereto. The invention can also be adapted to bipolar PROM's which write or read the data with a plural bit unit, such as $\times 4$ bit construction or $\times 8$ bit construction. In this case, the memory arrays MARY will be provided in a plurality of units such as four, eight, etc. The address buffer circuit and selection circuits such as row- and column-selecting circuits will be commonly used for the plurality of memory arrays. Such memory arrays and selection circuits can be commonly operated by a conventional method, and are not described here.

Figure 2:
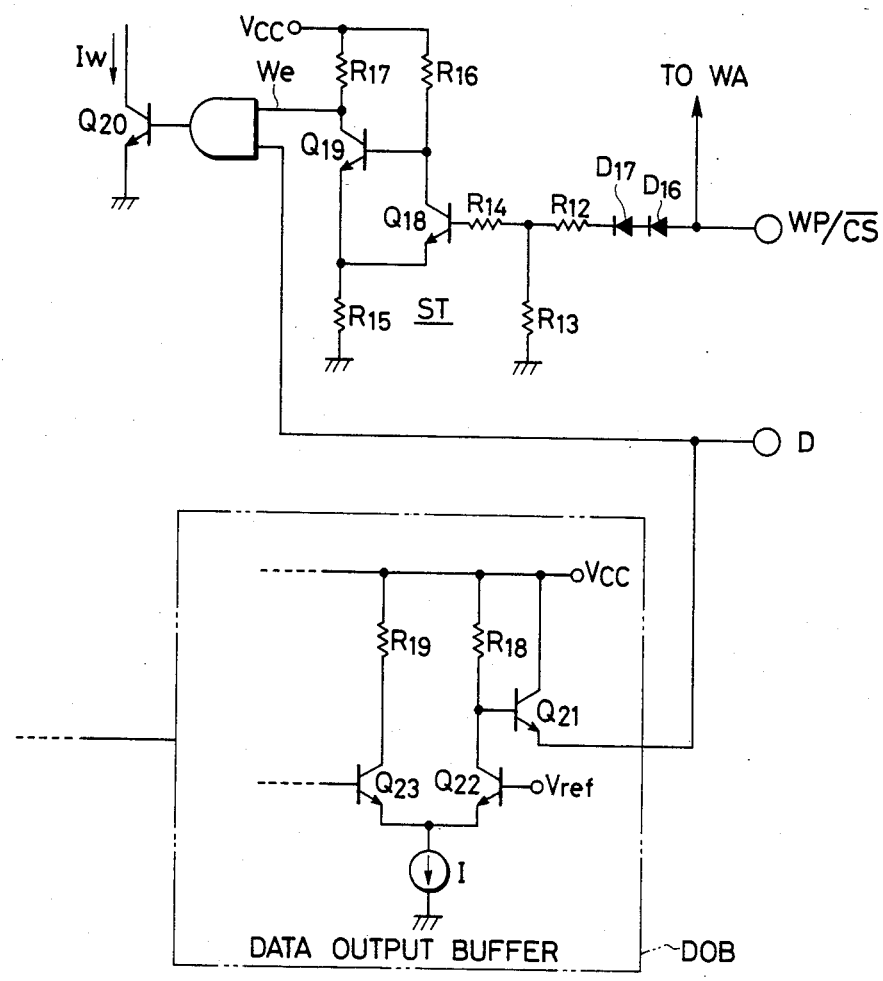
FIG. 2 is a circuit diagram showing major portions of the bipolar PROM that is shown in FIG. 1.

FIG. 2 is a diagram which concretely illustrates the above-mentioned Schmidt trigger circuit ST according to an embodiment of the invention. A circuit which discriminates the signal introduced from the terminal WP/$\overline{CS}$ is substantially comprised of the Schmidt trigger circuit ST and the level converter circuit LV.

Although there is no particular limitation, the level of the signal from the terminal WP/$\overline{CS}$ is shifted through diodes D16, D17, and is converted into a predetermined level by voltage-dividing resistors R12, R13. The signal of which the level is converted is applied to the base of the NPN-type bipolar transistor Q18 via a base resistor R14. The output from the collector of the transistor Q18 is input to the base of the NPN-type bipolar transistor Q19. An emitter resistor R15 is commonly connected to the emitters of these transistors Q18, Q19. Resistors R16, R17 are connected to the collectors of the transistors Q18,, Q19, respectively, and the writing control signal We is produced from the collector of the transistor Q19.

In this Schmidt trigger circuit ST, when a writing pulse WP of the high voltage is applied to the terminal WP/$\overline{CS}$, the transistor Q18 is rendered conductive by a signal whose level is converted by diodes D16, D17 and resistors R12, R13. Therefore, the transistor Q19 is rendered nonconductive, and a writing control signal We of the high level is produced from the collector of the transistor Q19. On the other hand, when a chip selection signal $\overline{CS}$ of the high level is applied to the terminal WP/$\overline{CS}$, the signal whose level is converted has a potential which is lower than that of when the above-mentioned writing pulse WP is applied to the terminal WP/$\overline{CS}$. Therefore, the transistor Q18 is rendered nonconductive, and the transistor Q19 is rendered conductive. Accordingly, a writing control signal We of the low level is produced from the collector of the transistor Q19. This also holds true even when a chip selection signal $\overline{CS}$ of the low level is applied to the terminal WP/$\overline{CS}$.

Although there is no particular limitation, the current source Iw for writing is comprised of an NPN-type bipolar transistor Q20 which receives the output of the gate circuit G through the base thereof.

FIG. 2 also shows concretely a portion of the internal circuit of the data output buffer DOB, i.e., shows a portion of the output stage.

The output stage circuit consists of NPN-type bipolar transistors Q22, Q23 which are coupled in a differential manner, load resistors R18, R19 therefor, a constant-current source I commonly connected to the emitters of the transistors Q22, Q23, and an open-emitter NPN-type bipolar transistor Q21 which receives the output from the collector of the transistor Q22.

A reference voltage Vref is supplied to the base of the transistor Q22, and a signal based upon the output signal of the sense amplifier SA is supplied to the base of the transistor Q23.

According to this embodiment in which the data output buffer DOB is made up of an ECL circuit, the operation speed is fast, and the reading operation can be performed at high speeds. The output transistor Q21 in the data output buffer DOB has an open-emitter form as described above. To prevent the transistor Q21 from breaking down, therefore, it is necessary to restrict the voltage applied to the input/output terminal D to a relatively small value. In the conventional bipolar PROM, a high voltage is applied to the input/output terminal D in order to write a desired data onto the memory element. Therefore, a serious elimination is imposed on the construction of the data output buffer. According to the bipolar PROM of the embodiment of the invention, on the other hand, the data is written onto the memory element without the need of applying a high voltage to the input/output terminal D. Compared with the conventional art, therefore, no limitation is imposed on the construction of the data output buffer DOB; i.e., the data output buffer DOB can be made up of an ECL circuit which is capable of operating at high speeds.

The writing operation of the bipolar PROM of the embodiment will be described below.

In the writing operation, a writing pulse WP is supplied to the terminal WP/$\overline{CS}$, the writing pulse WP having a voltage of, for example, as high as about several tens of volts and having a current of relatively as great as about 90 mA. Responsive to the writing pulse WP, the Schmidt trigger circuit ST converts the potential of the writing control signal We into the high level.

Described below is the reason for using the Schmidt trigger circuit ST for detecting the writing pulse WP.

In a PROM in which the memory elements are of the junction breakdown type, pulses of a constant current are applied to the terminal WP/$\overline{CS}$ during the writing operation. In this embodiment, a pulse of a constant current of about 90 mA is applied as a writing pulse WP to the terminal WP/$\overline{CS}$. The terminal WP/$\overline{CS}$ therefore assumes a potential of about several tens of volts. If the junction of a memory element selected by address signals is broken down by the writing pulse WP, the voltage drops little in the memory element. Accordingly, the voltage at the terminal WP/$\overline{CS}$ decreases to about 12 volts. In other words, even when the same current is supplied to the terminal WP/$\overline{CS}$, the voltage at the terminal WP/$\overline{CS}$ differs depending upon whether the junction of a memory element which is selected has been broken down or not, i.e., depending upon whether the data has been written or not. By measuring the voltage at the terminal WP/$\overline{CS}$, therefore, it is possible to know whether the data is written onto the memory element or not.

Although there is no particular limitation, a testing current of about 10 mA is supplied through the terminal WP/$\overline{CS}$ immediately after the writing pulse WP is applied to the terminal WP/$\overline{CS}$ in order to check whether the data is written on the selected memory element (i.e., to check whether the junction of the selected memory element is broken down). If the junction of the memory element has been broken down by the writing pulse WP, the testing current produces a reduced voltage drop through the memory element. When the testing current is supplied to the terminal WP/$\overline{CS}$, therefore, the potential at the terminal WP/$\overline{CS}$ assumes a voltage of as small as about 6 to 7 volts. When the junction of the memory element has not been broken down, on the other hand, the testing current produces a relatively great voltage drop through the memory element. When the testing current is supplied to the terminal WP/$\overline{CS}$, therefore, the potential at the terminal WP/$\overline{CS}$ assumes a voltage of relatively as high as about 9 volts. By detecting the potential at the terminal WP/$\overline{CS}$, therefore, it is allowed to discriminate whether the data is written on the selected memory element.

During the series of writing and testing operations, the transistor Q20 constituting the current source Iw must be maintained conductive. For this purpose, the potential of the writing signal We must be maintained at the high level even when the voltage at the terminal WP/$\overline{CS}$ has decreased to a low voltage of about 6 volts at the moment of testing immediately after the data is written.

In fact, however, a voltage of about 6 to 7 volts is often applied to the terminal WP/$\overline{CS}$ even when the data has not been written or the testing has not been effected. For instance, in a test for selecting defective PROM among a pluratity of PROMS, the input pins (terminals) are tested with regard to their leakage. The leakage test is performed by applying a relatively high voltage to the pins (terminals). Therefore, the voltage of about 6 volts may be applied to the terminal WP/$\overline{CS}$. The potential at the terminal WP/$\overline{CS}$ may also rise due to overshooting when a chip selection signal $\overline{CS}$ of the high level is applied to the terminal WP/$\overline{CS}$ in order to place the chip under the non-selected condition.

If the writing control signal We assumes the high level due to undesired rise in potential at the terminal WP/$\overline{CS}$, a relatively large current flows into the memory element at an undesired moment, and the memory element loses reliability.

According to the embodiment of the present invention, use is made of a Schmidt trigger circuit ST to detect the writing pulse WP, in order to prevent the memory element from losing reliability. That is, the Schmidt trigger circuit converts the potential of the writing control signal We into the high level, for the first time, when the voltage of greater than, for instance, 10 volts is applied to the terminal WP/$\overline{CS}$, and further has such hysteresis characteristics that the writing signal We of the high level is produced even when the potential at the terminal WP/$\overline{CS}$ is dropped to about 6 volts for the purpose of testing.

As the potential of the writing control signal We assumes the high level, the potential of the internal chip selection signal CS is forcibly lowered to the low level. Accordingly, the output of the data output buffer DOB assumes the condition of high impedance, and the unit row-selecting circuits WS0 to WS7 constituting the row-selecting circuit are all placed under the non-selected condition. If address signals from the terminals A0 to A7 are all of the low level, the unit address buffers XAB0' to XAB3' form internal address signals a0' to a3' of the high level. Therefore, diodes D10 to D14 provided in the unit writing circuit WA0 are all rendered nonconductive. Consequently, the transistors Q13 to Q15 coupled in the form of thyristors are all rendered conductive, and the writing current supplied to the terminal WP/$\overline{CS}$ is fed to the row line W0.

Upon receipt of address signals of the low level from the terminals A4 to A7, on the other hand, the address buffer YAB forms internal address signals $\overline{a4}$ to $\overline{a7}$ of the high level. Hence, a signal of the high level are applied to all of the emitters of the transistor Q8 that constitutes an address decoder in the unit column-selecting circuit BS0 among a plurality of unit column-selecting circuits that constitute the column-selecting circuit BS. Hence, only the transistor Q8 of the multi-emitter construction is rendered nonconductive in the unit column-selecting circuit BS0 among the transistors of the multi-emitter construction constituting address decoders in the unit column-selecting circuits. The transistor Q8 which is rendered nonconductive causes the transistor Q9 to be rendered conductive, and a selection signal of the high level is supplied to the column-selecting switching transistor Q10 only. As a result, the transistor Q10 only is rendered conductive among the plurality of switching transistors Q10 to Q12.

In the writing operation as described above, a row line and a column line designated by the address signals A0 to A7 are selected out of a plurality of row lines and column lines. A memory element provided at an intersecting point of the thus selected row line and the column line is the one that is selected by the address signals out of a plurality of memory elements which constitute a memory array.

When the transistor provided at an intersecting point of the thus selected row line W0 and the column line B0 prior to writing the data, is to be transformed into a diode construction, i.e., when the transistor prior to writing the data is to be transformed into a diode construction just like the one which is provided at an intersecting point of the other row line and the other column line (such as row line W7 and column line B7), a data of the high level should be supplied to the input/output terminal D. As the potential at the input/output terminal D assumes the high level, the transistor Q20 is rendered conductive, which constitutes a current source Iw which supplies an electric current of about 90 mA. This causes the base-emitter junction of the transistor provided at the intersecting point of the row line W0 and the column line B0 to be broken down (short-circuited). Therefore, the transistor is transformed into the diode construction as described above.

When the data is not to be written, on the other hand, a data of the low level is supplied to the input/output terminal D. This renders nonconductive the transistor Q20 which constitutes the current source Iw. Therefore, a constant current Ir for reading the data of only about 2 mA is permitted to flow into the column line B0 which is selected. Accordingly, the base-emitter junction of the above-mentioned transistor is not broken down.

Thus, the base-emitter junction of a transistor constituting a memory cell can be selectively broken down depending upon the level of a signal which is supplied to the input/output terminal D. In short, the writing operation can be performed.

Reading operation of the bipolar PROM of the embodiment will be described below.

In the reading operation, a chip selection signal $\overline{CS}$ is supplied to the terminal WP/$\overline{CS}$. That is, a chip selection signal $\overline{CS}$ of the high level having a relatively low voltage or of the low level is supplied to the terminal WP/$\overline{CS}$. The Schmidt trigger circuit ST does not respond to the chip selection signal $\overline{CS}$ which has a relatively low voltage and, hence, produces a writing control signal We of the low level. Since the signal We has the low level, the gate circuit G remains closed. Therefore, the current source Iw is placed under the inoperative condition. Namely, the transistor constituting the current source Iw is rendered nonconductive. Further, the unit writing circuits WA0 to WA7 are all placed under the non-selected condition, since the writing control signal We has the low level. The level converter circuit LV forms an internal chip selection signal CS in accordance with the chip selection signal $\overline{CS}$.

In the reading operation, a chip selection signal $\overline{CS}$ of the low level is supplied to the terminal WP/$\overline{CS}$. Therefore, the buffer circuit IB produces a selection signal CS1 of the high level, and the level converter circuit LV produces an internal chip selection signal CS of the high level which has been converted.

Since the potential of the internal chip selection signal CS is of the high level, the row-selecting circuit WS selects a row line that is designated by the address signals A0 to A3. That is, the row-selecting circuit WS selects a row line designated by the internal complementary address signals a0, $\overline{a0}$ to a3, $\overline{a3}$ that are formed by the address buffer XAB out of the plurality of row lines. For instance, when the address signals A0 to A3 are all of the low level, potentials of the lines DL2, DL4, DL6 and DL8 all assume the high level. This causes the transistor Q5 to be rendered nonconductive in the unit row-selecting circuit WS0. Accordingly, the unit row-selecting circuit WS0 selects the row line W0 out of the plurality of row lines W0 to W7.

To column line is selected in the same manner as the aforementioned writing operation. Namely, the column-selecting circuit BS selects a column line that is designated by the address signals A4 to A7 among the plurality of column lines. For instance, when the address signals A4 to A7 have potentials of the low level, potentials of the lines DL12, DL14, DL16 and DL18 assume the high level, whereby the transistor Q8 is rendered nonconductive in the unit column-selecting circuit BS0. Accordingly, the transistor Q10 is rendered conductive, and the column line B0 is selected.

Thus, by selecting a row line and a column line, a memory element provided at an intersecting point can be selected.

When the row line W0 and the column line B0 are selected as mentioned above, a memory element, i.e., a transistor on which the data has not been written, is selected as diagramed. In this case, therefore, the row line W0 and the column line B0 which are selected are coupled together via a memory element of high impedance. Hence, a constant reading current Ir flows from the transistor Q16 constituting the sense amplifier SA to the constantcurrent source Ir via the diode D7 and the column switching transistor Q10 which is rendered conductive. The sense amplifier SA therefore produces a signal of the low level.

When a row line W1 is selected instead of the row line W0, a memory element provided at an intersecting point of the row line W1 and the column line B0 is selected. In this case, the base-emitter junction of the selected memory element is broken down; i.e., the memory element is constituted by a transistor which is assuming the form of a diode. Accordingly, the row line W1 and the column line B0 are coupled together via a memory element of low impedance. A constant reading current Ir then flows from the unit row-selecting circuit WSO to the constant-current source Ir via the row line W1 and the above-mentioned memory element of the form of a diode. The sense amplifier SA therefore produces a signal of the high level. That is, a reference voltage $V_S$ supplied to the base of the transistor Q16 constituting the sense amplifier SA is set to a predetermined value that is lower than the voltage which is supplied to the base of the drive transistor Q7. Accordingly, the diode D7 is rendered nonconductive. In other words, the reference voltage $V_S$ for reading the data supplied to the sense amplifier SA is so set that the memory element and the reading diode D7 will operate in a differential manner. Namely, in the reading operation, a differential circuit is substantially constituted by the drive transistor Q7, memory element, diode D7, and transistor Q16.

The signal produced by the sense amplifier SA is sent to an external unit from the input/output terminal D via the data output buffer DOB.

Unlike the conventional bipolar PROM in which the writing signal WP of a high voltage is supplied to the data terminal D, the writing operation according to the present invention is carried out by supplying the writing signal WP to another terminal WP/$\overline{CS}$ and supplying the writing signal (data) of an ordinary logic level to the data terminal D. Accordingly, the data output buffer DOB can be constituted by a circuit having a low withstand voltage such as an ECL circuit, and hence the reading operation can be performed at high speeds.

The column-selecting circuit can be commonly used for the writing operation and the reading operation. The circuit for selecting the writing circuit WA can be made up of a simply constructed diode matrix. This makes it possible to simplify the circuit for selecting the memory cells and, hence, enables the chip size to be reduced.

With the construction of the selection circuit being simplified, the number of elements can be greatly reduced in the selection circuit. Therefore, the power dissipation of the bipolar PROM can be greatly reduced.

In the above-mentioned embodiment, the address decoder for selecting the writing circuit WA is comprised of a diode matrix, and the address signals therefor are formed by the TTL circuit. Therefore, the writing circuit WA exhibits a sufficiently great withstand voltage against relatively high voltages.

There is no need of increasing the number of terminals since the terminal WP/$\overline{CS}$ is commonly used for receiving both the chip selection signals and the writing signals WP. The same plackage for the conventional bipolar PROM can also be used for the bipolar PROM of the present invention if it has the same memory capacity; i.e., the bipolar PROM of the invention is compatible with the conventional bipolar PROM.

The reading current is produced by a constant-current source. Therefore, the reading operation can be stably carried out without affected by variance in the characteristics of elements or by variation in the power source voltage.

In the foregoing was concretely described an embodiment of the present invention that was accomplished by the inventors. It should, however, be noted that the invention is in no way limited to the above-mentioned embodiment only, but can be modified in a variety of other ways without departing from the spirit and scope of the invention. For instance, the chip selection signal CS and the writing signal WP may be supplied through separately provided terminals. Further, the complementary address signals for selecting the writing circuit WA may be the signals produced by the address buffer XADB that is made up of an ECL circuit.

Moreover, the circuit which forms internal control signals CS, We, etc. may be constructed in a variety of forms. Any control operation may be carried out by using these control signals CS, We provided it realizes substantially the same operation as the aforementioned embodiment.

In the foregoing was described the case when the invention accomplished by the inventors was adapted to the bipolar PROM that constitutes the background of the invention. The invention, however, is in no way limited thereto. For instance, the invention can also be extensively utilized for the semiconductor memory devices employing memory elements that are capable of semi-permanently changing the impedance from one condition to another condition when the data is written with a relatively high voltage in excess of the withstand voltage of, for example, the ECL circuit. The memory elements may be fuse elements.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A semiconductor memory device including:
   (a) a plurality of memory elements each of which has a first terminal and a second terminal, and each of which is capable of semi-permanently changing its impedance from a given value to another value;
   (b) a selecting circuit which receives address signals and which selects a memory element designated by the address signals out of said plurality of memory elements;
   (c) a third terminal which is supplied with a writing current;
   (d) a fourth terminal which is supplied with a writing signal that is to be written on a selected one of said plurality memory elements; and
   (e) a control circuit having a writing circuit which, when the writing current is supplied to said third terminal, supplies the writing current from said third terminal to the first terminal of the memory element that is selected by the selecting circuit out of said plurality of said plurality of memory elements, and which further supplies a current in accordance with the writing signal sent from said fourth terminal to the second terminal of said selected memory element so that the impedance of the selected memory element is set to a value which complies with the writing signal,
   wherein said selecting circuit comprises a first selecting circuit and a second selecting circuit, wherein said first selecting circuit receives said address signals and selects said selected memory element in the reading operation when a first level signal of said writing current is supplied to said third terminal, and wherein said second selecting cirucit receives said address signals and selects said selected memory element in the writing operation when a second level signal of said writing current is supplied to said third terminal.

2. A semiconductor memory device according to claim 1, wherein said first selecting circuit operates at a higher speed than said second selecting circuit and said second selecting circuit operates at a higher voltage than said first selecting circuit.

3. A semiconductor memory device according to claim 2, wherein said control circuit comprises a discrimination circuit which discriminates a level of a writing current signal supplied to said third terminal, which controls said first selecting circuit to go into an operating condition and said second selecting circuit to go into a non-operating condition in said reading operation when said first level signal of said writing current is supplied to said third terminal and which controls said first selecting circuit to go into a non-operating condition and said second selecting circuit to go into an operating condition in said writing operation when said second level signal of said writing current is supplied to said third terminal and an output circuit which has an output terminal coupled to said fourth terminal, which is operated by said discrimination circuit and produces to said output terminal an output signal that complies with the impedance of said selected memory element in said reading operation, and wherein a signal stored in said selected memory element is read out from said fourth terminal.

4. A semiconductor memory device according to claim 3, wherein said first selecting cirucit of high speed comprises ECL circuits.

5. A semiconductor memory device according to claim 4, wherein said discrimination circuit comprises a Schmidt trigger circuit which receives said writing current signal introduced through said third terminal.

6. A semiconductor memory device according to claim 5, wherein said output circuit comprises an ECL circuit and an open-emitter-connected bipolar transistor of which the emitter is connected to said output terminal.

* * * * *